United States Patent [19]
Durec et al.

[11] Patent Number: 6,100,721
[45] Date of Patent: Aug. 8, 2000

[54] CIRCUIT AND METHOD OF EXTENDING THE LINEAR RANGE OF A PHASE FREQUENCY DETECTOR

[75] Inventors: Jeffrey C. Durec; David K. Lovelace, both of Chandler, Ariz.; Albert H. Higashi, Lawrenceville, Ga.

[73] Assignee: Motorola, Inc., Schaumburg, Ill.

[21] Appl. No.: 09/241,669

[22] Filed: Feb. 1, 1999

[51] Int. Cl.[7] .................................................. G01R 25/00
[52] U.S. Cl. ................... 327/3; 327/7; 327/12; 327/5; 327/148; 327/151; 327/157
[58] Field of Search ................................. 327/3, 5, 7, 12, 327/148, 151, 157

[56] References Cited

U.S. PATENT DOCUMENTS

| | | | |
|---|---|---|---|
| 4,280,099 | 7/1981 | Rattlingourd | 328/63 |
| 4,970,475 | 11/1990 | Gillig | 331/25 |
| 5,349,309 | 9/1994 | Fujii | 331/17 |
| 5,604,775 | 2/1997 | Saitoh et al. | 375/376 |
| 5,610,954 | 3/1997 | Miyashita | 375/375 |
| 5,727,038 | 3/1998 | May et al. | 375/376 |
| 5,744,991 | 4/1998 | Jefferson et al. | 327/158 |

*Primary Examiner*—Margaret R. Wambach
*Assistant Examiner*—Cassandra Cox
*Attorney, Agent, or Firm*—Lanny L. Parker

[57] ABSTRACT

A wireless communication system (10) uses a phase detector (28) having a first pair of flip-flops (50, 56) for detecting the phase difference between an input frequency and a reference frequency. The first pair of flip-flops control current sources (66, 70) in the charge pump of the phase detector to modulate the error signal. A second pair of flip-flops (52, 58) detect when the input frequency is more than $2\pi$ ahead of or behind the reference frequency. The second pair of flip-flops increment and decrement a counter (54) which in turn controls additional current sources (78–88) in the charge pump. The additional current sources extend the linear operating range of the error signal when the phase error exceeds $\pm 2\pi$.

20 Claims, 3 Drawing Sheets

CIRCUIT AND METHOD OF EXTENDING THE LINEAR RANGE OF A PHASE FREQUENCY DETECTOR

BACKGROUND OF THE INVENTION

The present invention relates in general to phase frequency detection circuits and, more particularly, to a phase detector having an extended linear operating range.

Most if not all wireless communication systems transmit and receive information on a modulated carrier frequency. The radio frequency (RF) signal transmitted across the air-ways is a high frequency carrier modulated by the signal level of the transmitted information. In a cordless telephone, for example, the voice and/or data to be transmitted is modulated and frequency up-converted for transmission by a transmitter section. The received voice and/or data is frequency down-converted and demodulated in a receiver section to hear in the speaker or see in the phone display.

The transmitter and receiver sections typically use synthesizers for the frequency conversion and modulation processes. The synthesizers include a phase detector, operating within a phase locked loop (PLL), to control an oscillator frequency used for the frequency conversion and modulation. The phase detector compares the phase difference between a reference frequency and the oscillator frequency and produces an error signal representative of the phase difference. The phase detector should operate in a linear range in terms of error signal versus phase difference. In the prior art, the phase detector becomes non-linear when the phase difference exceeds $\pm 2\pi$, which occurs when the reference frequency and oscillator frequency are substantially different. The non-linear region of the phase detector prevents the PLL from readily re-acquiring phase lock if the phase between the reference frequency and oscillator frequency become significantly different.

Hence, a need exists to extend the linear operating range of a phase detector beyond a phase difference of $\pm 2\pi$.

DETAILED DESCRIPTION OF THE PREFERRED EMBODIMENT

Figure 1:
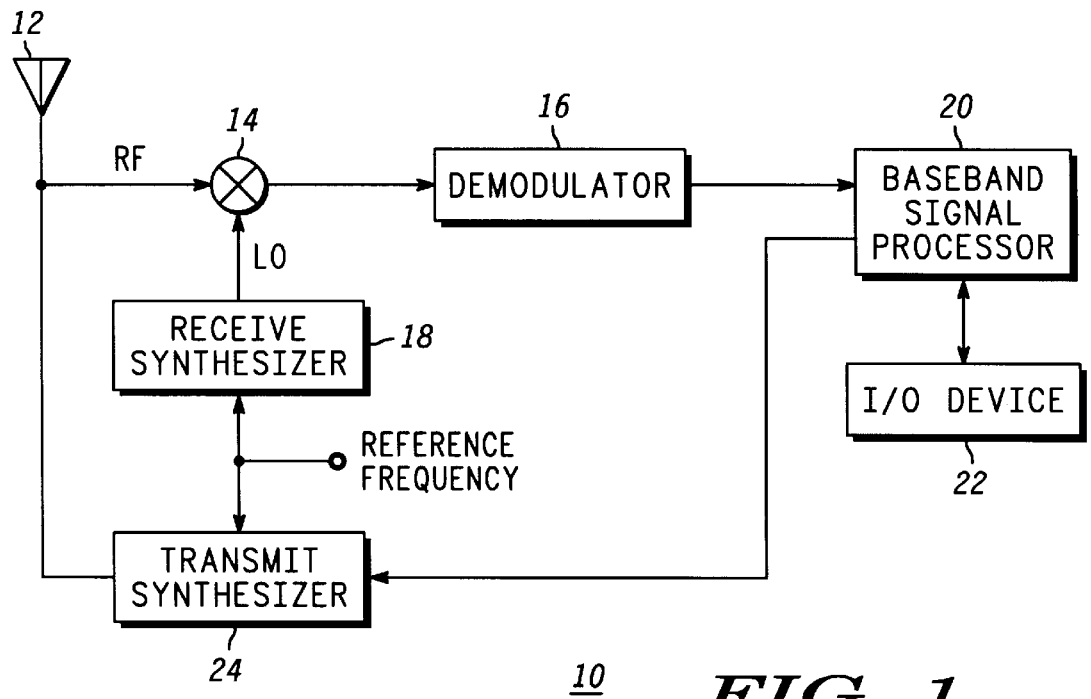
FIG. 1 illustrates a block diagram of a wireless communication system.

Referring to FIG. 1, a wireless communication system 10 is shown suitable for manufacturing as one or more integrated circuits (ICs) using conventional IC manufacturing processes. Wireless communication system 10 represents a number of products including cordless telephones, pagers, mobile telephones, two-way radios, and other remote communication devices. An antenna 12 receives voice and/or data signals modulated on an RF carrier. The received signal is frequency down-converted by mixer 14 and demodulated by demodulator 16. A receive synthesizer 18 provides a local oscillator (LO) signal to mixer 14 in response to a reference frequency for the frequency down-conversion. Mixer 14, demodulator 16, and synthesizer 18 comprise the receiver section of wireless communication system 10. The construction and operation of mixer 14, demodulator 16, and synthesizer 18 are well known in the art. Baseband signal processor 20 receives the baseband voice and/or data signals and processes the information for I/O device 22. I/O device 22 represents a visual display, a speaker, a microphone, or other device to convert the information to human perceivable form.

The transmitter section of wireless communication system 10 includes transmit synthesizer 24. The baseband voice and/or data signals from baseband signal processor 20 are applied to synthesizer 24 for modulation and frequency up-conversion to an RF signal for transmission by antenna 12. The reference frequency is also applied to synthesizer 24 for use in the modulation and frequency up-conversion processes.

Figure 2:
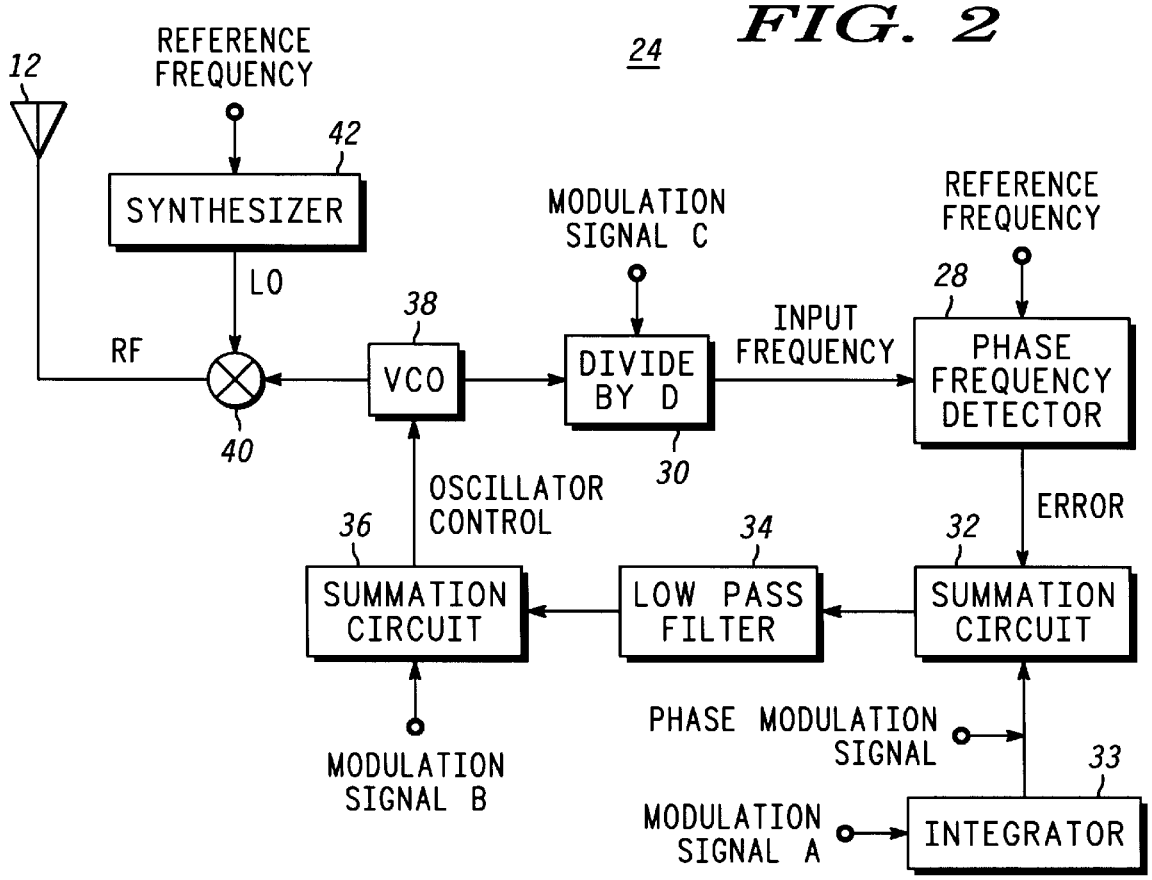
FIG. 2 is a block diagram of the transmit synthesizer of FIG. 1.

Further detail of transmit synthesizer 24 is shown in FIG. 2. Phase frequency detector 28 receives the reference frequency and compares it to an input frequency from divide-by-D circuit 30, where D is typically an integer value. An error signal (E) representative of the phase difference or phase error ($\phi_R - \phi_I$) between the phase of the reference frequency ($\phi_R$) and the phase of the input frequency ($\phi_I$) is applied to one input of summation circuit 32. A second input of summation circuit 32 receives modulation signal A as integrated by integrator 33. The output signal of summation circuit 32 is low-pass filtered by low-pass filter 34 and applied to one input of summation circuit 36. Low-pass filter 34 is implemented as a capacitor having a value of say 10 nanofarads. A second input of summation circuit 36 receives modulation signal B. The output signal of summation circuit 36 is the oscillator control signal for voltage or current controlled oscillator (VCO) 38. The magnitude of the oscillator control signal determines the frequency of VCO 38. The output frequency of VCO 38 is divided down by divide-by-D circuit 30. The value of D for divide-by-D circuit 30 is set by modulation signal C. The output of divide-by-D circuit 30 provides the input frequency to phase detector 28.

Phase detector 28, low-pass filter 34, VCO 38, and divide-by-D circuit 30 operate as a phase locked loop. Phase detector 28 outputs an error signal representative of the phase difference between the reference frequency and the input frequency. The error signal is low-passed filtered and controls VCO 38 to generate an oscillator signal having a frequency D times the reference frequency.

Modulation signal A, modulation signal B, and modulation signal C are each derived from the voice and/or data signals to be transmitted from base signal processor 20. Modulation signals A, B, and C can be used individually, or in combinations, to achieved the desired modulation. Modulation signal A is a frequency modulation signal, for example, an analog (voice) or digital (data) signal having a frequency that varies over time based on the information content provided by baseband signal processor 20. Modulation signal A may have a frequency within the closed loop bandwidth of the PLL. Modulation signal A is integrated by integrator 33 to provide a phase modulation signal. Alternatively, a phase modulation signal can be directly applied to summation circuit 32 as shown in FIG. 2. The phase modulation signal sums with the error signal from phase detector 28 and phase modulates the error signal. The VCO 38 is frequency modulated with the information content of the phase modulated error signal.

In a similar manner, modulation signal B is a frequency modulation signal, for example, an analog or digital signal having a frequency that varies over time based on the information content provided by baseband signal processor 20. Preferably, modulation signal B has a frequency greater than the closed loop bandwidth of the PLL. Otherwise, the PLL will filter out the modulation frequency. Because modulation signal B is added with the low-pass filtered error signal, modulation signal B directly frequency modulates VCO 38.

Modulation signal C modulates the frequency of VCO 38 by changing the value of D, e.g. from 1000 to 1001. The voice and/or data signal from baseband signal processor 20 controls a synthesizer (not shown) that dynamically changes the value of D. The rate at which the value of D changes determines the modulation frequency. If for example the value of D is changed at a 1 KHz rate, then a 1 KHz tone is ultimately modulated on the VCO output frequency.

The oscillator signal from VCO 38, as modulated by the voice and/or data signals, is frequency up-converted by mixer 40. Mixer 40 receives a local oscillator signal from synthesizer 42 based on the reference frequency. The RF signal from mixer 40 is transmitted by antenna 12 to the desired destination.

Figure 3:
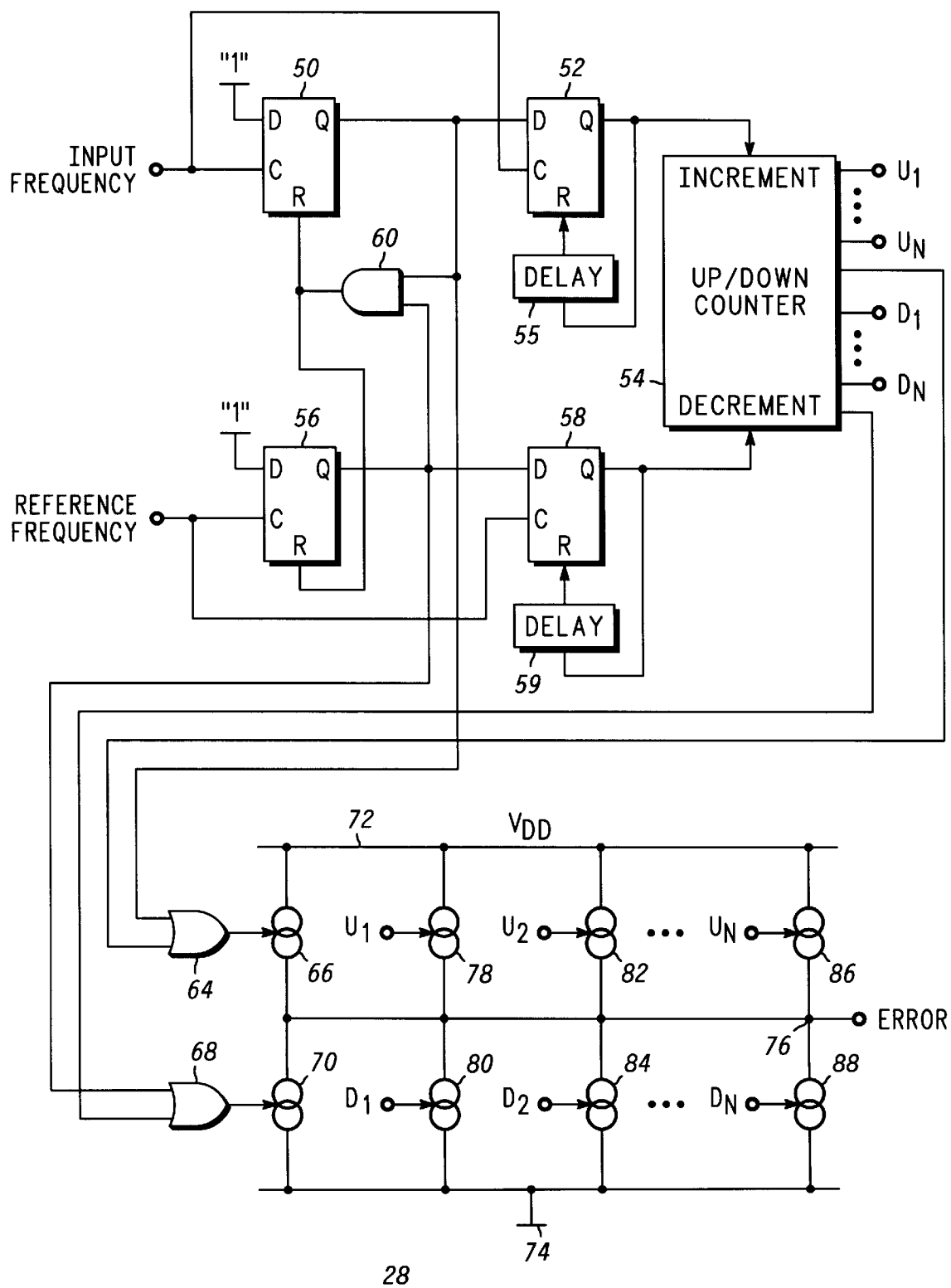
FIG. 3 is a schematic diagram of the phase detector of FIG. 2.

As part of the present invention, phase detector 28 has an extended linear operating range and can handle phase differences between the input frequency and the reference frequency greater than $\pm 2\pi$ without losing the ability to readily re-acquire phase lock. Turning to FIG. 3, phase detector 28 includes D-type flip-flop 50 or other suitable latching circuit having a clock input coupled for receiving the input frequency from divide-by-D circuit 30. On the rising edge of the input frequency signal, flip-flop 50 latches the logic one on its data input to its Q-output. The $U_0$ signal is logic one. Absent a reset to flip-flop 50, the next rising edge of the input frequency signal clocks the logic one on the data input of D-type flip-flop 52 to its Q-output. Up/down counter 54 receives a rising edge to a logic one on its increment input and increases its count by one. The Q-output of flip-flop 52 is routed through delay circuit 55 to a reset input of flip-flop 52. The delay circuit 55 is implemented with a series of inverters with sufficient delay to allow counter 54 to increment on the rising edge of the Q-output of flip-flop 52. After its rising edge, the Q-output of flip-flop 52 is reset by delay circuit 55.

D-type flip-flop 56 or other suitable latching circuit has a clock input coupled for receiving the reference frequency. On the rising edge of the reference frequency signal, flip-flop 56 latches the logic one on its data input to its Q-output. The $D_0$ signal is logic one. Absent a reset to flip-flop 56, the next rising edge of the reference frequency signal clocks the logic one on the data input of D-type flip-flop 58 to its Q-output. Other suitable latching circuits may be used for flip-flop 52 and 58. Up/down counter 54 receives a rising edge to a logic one on its decrement input and decreases its count by one. The Q-output of flip-flop 58 is routed through delay circuit 59 to a reset input of flip-flop 58. The delay circuit 59 is implemented with a series of inverters with sufficient delay to allow counter 54 to decrement on the rising edge of the Q-output of flip-flop 52. After its rising edge, the Q-output of flip-flop 58 is reset by delay circuit 59. Flip-flops 50 and 56 are reset when $U_0$ and $D_0$ are logic one at the same time. In such a case, the output of AND gate 60 goes to logic one and resets the Q-outputs of flip-flops 50 and 56 to logic zero.

Up/down counter 54 has up outputs $U_1$–$U_N$ and $U_{over}$ and down outputs $D_1$–$D_N$ and $D_{over}$, where N is the number of output bits for the up outputs and the down outputs. Outputs $U_1$–$U_N$ count positive values in a sequential fashion in response to the increment input, e.g. "0000", "0001", "0011", "0111", and "1111", until $U_{over}$ goes to logic one indicating a positive overflow condition in the count value. Outputs $D_1$–$D_N$ count negative values in a sequential fashion in response to the decrement input, e.g. "0000", "0001", "0011", "0111", and "1111", until $D_{over}$ goes to logic one indicating a negative overflow condition in the count value.

The $U_0$ and $U_{over}$ signals are applied to OR gate 64. The output of OR gate 64 is coupled to the control input of current source 66. The $D_0$ and $D_{over}$ signals are applied to OR gate 68. The output of OR gate 68 is coupled to the control input of current source 70. Current source 66 is referenced to power supply conductor 72 operating at a positive potential such as $V_{DD}$=5 volts. Current source 70 is referenced to power supply conductor 74 operating at ground potential. The outputs of current sources 66 and 70 are coupled to output node 76 for providing the error signal of phase detector 28. Current source 78 is controlled by the $U_1$ signal and supplies current into node 76. Likewise, current sources 80, 82, 84, 86, and 88 are controlled by the $D_1$, $U_2$, $D_2$, $U_N$, and $D_N$ signals, respectively, and each supplies a current into node 76. Current sources 66, 70, and 78–88 and OR gates 64 and 68 represent the charge pump portion of phase detector 28. Current sources 66, 70, and 78–88 are controllable current sources each set to a value of 100 microamps, although other values are within the scope of the present invention.

In an alternate embodiment, counter 54 counts in a binary fashion, e.g. "0000", "0001", "0010", "0011", etc. In such a case, current sources 78–88 are set to have corresponding increasing values. Counter 54 may have a single set of outputs with a sign bit to indicate positive and negative count values.

When the PLL is in phase lock and the input frequency is substantially equal to the reference frequency, then the Q-output of flip-flop 50 goes to logic one about the same time as the Q-output of flip-flop 56, with any difference being representative of the phase error between the input frequency and reference frequency. When the $U_0$ signal goes to logic one, then the output of OR gate 64 goes to logic one and enables current source 66 to source current into node 76. When the $D_0$ signal goes to logic one, then the output of OR gate 68 goes to logic one and enables current source 70 to sink current from node 76. Flip-flops 50 and 56 operate as a phase detector for detecting the phase difference between an input frequency and a reference frequency and controlling current sources 66 and 70 in the charge pump to modulate the error signal. When the $U_0$ signal and the $D_0$ signal are both logic one, then the output of AND gate 60 goes to logic one and resets flip-flops 50 and 56. The $U_0$ signal and the $D_0$ signal return to logic zero and disable current sources 66 and 70. The PLL operates to minimize the phase error in part by controlling current sources 66 and 70 to set the proper level of the error signal, which in turn controls the input frequency signal to phase align with the reference frequency signal.

When the input frequency is substantially different than the reference frequency, for example, such that the phase difference is a greater than $\pm 2\pi$, then it is important for the PLL to be able to rapidly re-acquire phase lock. Assume that the first rising edge of the input frequency signal sets the $U_0$ signal to logic one. If the input frequency is substantially greater than the reference frequency, then the $U_0$ signal is still logic one when the second rising edge of the input frequency signal arrives because the rising edge of the reference frequency signal has not yet arrived. Flip-flop 52 latches the logic one present on its data input and increments counter 54 on the rising edge. Flip-flop 52 is reset after the delay. The $U_1$ signal goes to logic one and enables current source 78 to source current into node 76. If the third rising edge of the input frequency signal arrives before the rising edge of the reference frequency signal, then flip-flop 52 latches another logic one on its Q-output and increments counter 54 again on the rising edge. Flip-flop 52 is reset after the delay. The $U_2$ signal goes to logic one and enables current source 82 to source current into node 76. Now both current source 78 and current source 82 are sourcing current into node 76. The process continues incrementing counter 54 and enabling further current sources into node 76 with each rising edge of the input frequency signal until the rising edge of the reference frequency signal arrives which resets flip-flops 50 and 56. The outputs of counter 54 remain at their present state until decremented as described below.

The first rising edge of the reference frequency signal sets the $D_0$ signal to logic one. If the second rising edge of the reference frequency signal arrives before the rising edge of the input frequency signal, i.e. phase difference between the reference frequency and input frequency is greater than $2\pi$, then flip-flop 58 latches the logic one present on its data input and decrements counter 54 on the rising edge. Flip-flop 58 is reset after the delay. If the $U_1$–$U_N$ signals are previously set, then the decrement counts down counter 54 toward zero while disabling currents sources along the way. For example, if the $U_1$ and $U_2$ outputs of counter 54 are set to logic one, then the first decrement would set $U_2$ to logic zero and disable current source 82, and the second decrement would set $U_1$ to logic zero and disable current source 78. If counter 54 is already at zero, the decrement sets the $D_1$ signal to logic one and enables current source 80 to sink current from node 76. If the third rising edge of the reference frequency signal arrives before the rising edge of the input frequency signal, then flip-flop 58 latches another logic one on its Q-output and decrements counter 54 again on the rising edge. Flip-flop 58 is reset after the delay. The $D_2$ signal goes to logic one and enables current source 84 to sink current from node 76. The process continues decrementing counter 54 and enabling further current sources into node 76 with each rising edge of the reference frequency signal until the rising edge of the input frequency signal arrives which resets flip-flops 50 and 56.

The second pair of flip-flops 52 and 58 detect when the phase of the input frequency is more than $2\pi$ ahead of or behind the phase of the reference frequency. The second pair of flip-flops increment and decrement a counter which in turn controls current sources 78–88 in the charge pump. Current sources 66 and 70 are pulse width modulated as each is turned on for a period of time as determined by the phase difference between the input frequency and the reference frequency. The current sources 78–88 remain conducting in response to the count value and extend the linear operating range of the error signal by incrementally sourcing current into node 76. The error signal changes linearly with the phase difference between the input frequency and the reference frequency, even when the phase difference exceeds $\pm 2\pi$. The error signal alters the frequency of VCO 38 to minimize the phase difference and bring the input frequency and the reference frequency back in phase alignment.

If counter 54 overflows on the increment, then $U_{over}$ goes to logic one. OR gate 64 allows the $U_{over}$ signal to override the $U_0$ signal. The output of OR gate 64 stays logic one independent of the $U_0$ signal to keep current source 66 conducting which clamps the error signal to maximum value. Similarly, if counter 54 overflows on the decrement, then $D_{over}$ goes to logic one. OR gate 68 allows the $D_{over}$ signal to override the $D_0$ signal. The output of OR gate 68 stays logic one independent of the $D_0$ signal to keep current source 70 conducting which clamps the error signal to minimum value.

Figure 4:
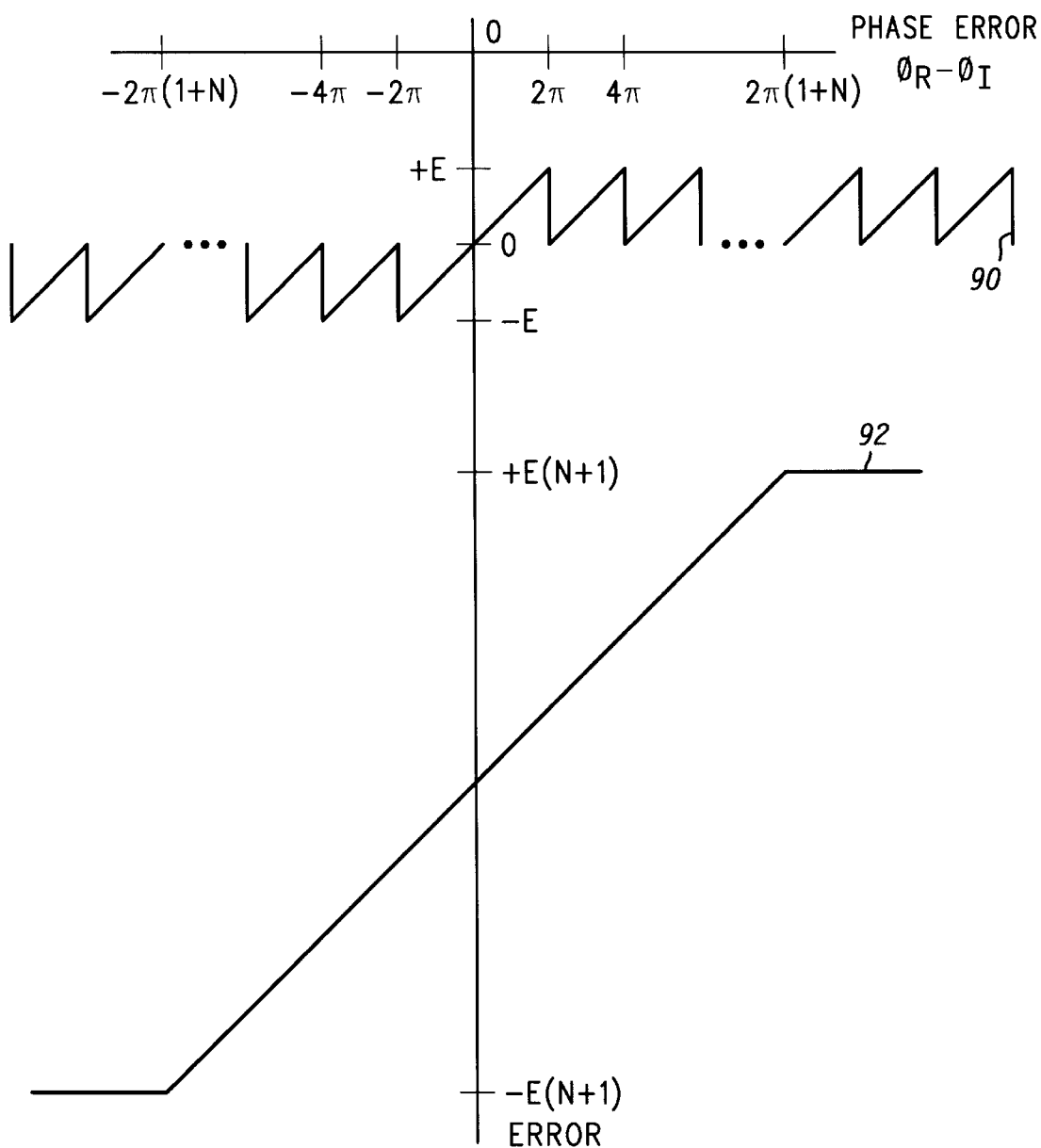
FIG. 4 is a waveform plot useful in the explanation of the preferred embodiment.

A plot of phase error ($\phi_R$–$\phi_I$) versus error signal (E) is shown in FIG. 4. Waveform 90 illustrates a plot of phase error versus error signal using a phase detector known in the prior art. The error signal becomes non-linear when the phase difference exceeds $\pm 2\pi$. Waveform 92 illustrates a plot of phase error versus error signal using the phase frequency detector embodied in the present invention. The linear operating range of the error signal over phase error is clearly improved using phase detector 28. The plot of waveform 92 further illustrates the clamping feature provided by the $U_{over}$ signal and $D_{over}$ signal overriding the $U_0$ and $D_0$ signals to keep current sources 66 and 70 conducting.

In summary, the present invention provides a phase detector in a PLL of a wireless communication system. The phase detector includes a first pair of flip-flops for detecting the phase difference between an input frequency and a reference frequency. The first pair of flip-flops control current sources in the charge pump of the phase detector to modulate the error signal. A second pair of flip-flops detect when the phase of the input frequency is more than $2\pi$ ahead of or behind the phase of the reference frequency. The second pair of flip-flops increment and decrement a counter which in turn controls additional current sources in the charge pump. The additional current sources extend the linear operating range of the error signal when the phase error exceeds $\pm 2\pi$.

What is claimed is:

1. A phase detector circuit, comprising:
    a first latching circuit having inputs coupled for receiving first and second input signals;
    a second latching circuit having an input coupled to an output of the first latching circuit;
    a counter having an input coupled to an output of the second latching circuit;
    a first current source having a control input coupled to the output of the first latching circuit and an output coupled to an output of the phase detector circuit; and
    a second current source having a control input coupled to an output of the counter and an output coupled to the output of the phase detector circuit.

2. The phase detector circuit of claim 1 wherein the second latching circuit includes a first latch having a data input coupled to a first output of the first latching circuit, a clock input coupled for receiving the first input signal, and an output coupled to an increment input of the counter.

3. The phase detector circuit of claim 2 wherein the second latching circuit further includes a second latch having a data input coupled to a second output of the first latching circuit, a clock input coupled for receiving the second input signal, and an output coupled to an decrement input of the counter.

4. The phase detector circuit of claim 3 wherein the second current source includes:
    a first controllable current source coupled between a first power supply conductor and the output of the phase detector circuit and having a control input coupled to a first output of the counter; and
    a second controllable current source coupled between a second power supply conductor and the output of the phase detector circuit and having a control input coupled to a second output of the counter.

5. The phase detector circuit of claim 4 wherein the first latching circuit includes:
    a third latch having a data input coupled for receiving a first logic signal, a clock input coupled for receiving the first input signal, and an output coupled to the data input of the first latch;

a fourth latch having a data input coupled for receiving a second logic signal, a clock input coupled for receiving the second input signal, and an output coupled to the data input of the second latch; and a first logic gate having a first input coupled to the output of the third latch, a second input coupled to the output of the fourth latch, and an output coupled to a reset input of the third latch and to a reset input of the fourth latch.

6. The phase detector circuit of claim 5 wherein the first current source includes:

a third controllable current source coupled between the first power supply conductor and the output of the phase detector circuit and having a control input coupled to the output of the third latch; and a fourth controllable current source coupled between the second power supply conductor and the output of the phase detector circuit and having a control input coupled to the output of the fourth latch.

7. The phase detector circuit of claim 6 further including a second logic gate having a first input coupled to the output of the third latch, a second input coupled to a third output of the counter representing an overflow condition, and an output coupled to the control input of the third controllable current source.

8. A method of comparing phase difference between first and second input signals, comprising the steps of:

supplying a first current into an output node upon receiving a first occurrence of the first input signal to provide an error signal representing the phase difference between the first and second input signals;

altering a count value if a second occurrence of the first input signal is received before the second input signal; and supplying a second current into the output node in response to the count value.

9. The method of claim 8 further including the steps of:

latching a first logic state at a first node upon receiving the first occurrence of the first input signal;

latching a second logic state at a second node if the second occurrence of the first input signal is received before the second input signal; and altering the count value in response to the second logic state at the second node.

10. The method of claim 9 further including the steps of:

controlling a first current source in response to the first logic state at the first node to supply the first current into the output node; and controlling a second current source in response to the count value to supply the second current into the output node.

11. The method of claim 10 further including the step of overriding control of the first current source in response to an overflow condition from the count value to supply the first current into the output node.

12. In a wireless communication system, a phase lock loop modulating an oscillator signal with transmission data, the phase lock loop including a phase detector to compare phase difference between first and second input signals to the phase lock loop, the phase detector comprising:

a first latching circuit having inputs coupled for receiving the first and second input signals;

a second latching circuit having an input coupled to an output of the first latching circuit;

a counter having an input coupled to an output of the second latching circuit;

a first current source having a control input coupled to the output of the first latching circuit and an output coupled to an output of the phase detector; and a second current source having a control input coupled to an output of the counter and an output coupled to the output of the phase detector.

13. The phase detector of claim 12 wherein the second latching circuit includes:

a first latch having a data input coupled to a first output of the first latching circuit, a clock input coupled for receiving the first input signal, and an output coupled to an increment input of the counter; and a second latch having a data input coupled to a second output of the first latching circuit, a clock input coupled for receiving the second input signal, and an output coupled to a decrement input of the counter.

14. The phase detector of claim 13 wherein the second current source includes:

a first controllable current source coupled between a first power supply conductor and the output of the phase detector and having a control input coupled to a first output of the counter; and a second controllable current source coupled between a second power supply conductor and the output of the phase detector and having a control input coupled to a second output of the counter.

15. The phase detector of claim 14 wherein the first latching circuit includes:

a third latch having a data input coupled for receiving a first logic signal, a clock input coupled for receiving the first input signal, and an output coupled to the data input of the first latch;

a fourth latch having a data input coupled for receiving a second logic signal, a clock input coupled for receiving the second input signal, and an output coupled to the data input of the second latch; and a first logic gate having a first input coupled to the output of the third latch, a second input coupled to the output of the fourth latch, and an output coupled to a reset input of the third latch and to a reset input of the fourth latch.

16. The phase detector of claim 15 wherein the first current source includes:

a third controllable current source coupled between the first power supply conductor and the output of the phase detector and having a control input coupled to the output of the third latch; and a fourth controllable current source coupled between the second power supply conductor and the output of the phase detector and having a control input coupled to the output of the fourth latch.

17. A circuit for comparing a phase difference between first and second input signals, comprising:

a phase detector having first and second inputs coupled for receiving the first and second input signals, a first output providing a signal representative of the phase difference between the first and second input signals, and a second output indicating if first and second occurrences of the first input signal occur prior to the second input signal;

a first current source having a control input coupled to the first output of the phase detector and an output coupled to an output of the circuit;

a counter having an input coupled to the second output of the phase detector; and a second current source having a control input coupled to an output of the counter and an output coupled to the output of the circuit.

18. The circuit of claim 17 wherein the phase detector includes:

a first latch having a data input coupled for receiving a first logic signal, and a clock input coupled for receiving the first input signal;

a second latch having a data input coupled for receiving a second logic signal, and a clock input coupled for receiving the second input signal;

a third latch having a data input coupled to an output of the first latch, a clock input coupled for receiving the first input signal, and an output coupled to an increment input of the counter;

a fourth latch having a data input coupled to an output of the second latch, a clock input coupled for receiving the second input signal, and an output coupled to an decrement input of the counter; and a first logic gate having a first input coupled to the output of the first latch, a second input coupled to the output of the second latch, and an output coupled to a reset input of the first latch and to a reset input of the second latch.

19. The circuit of claim 18 wherein the second current source includes:

a first controllable current source coupled between a first power supply conductor and the output of the phase detector and having a control input coupled to a first output of the counter; and a second controllable current source coupled between a second power supply conductor and the output of the phase detector and having a control input coupled to a second output of the counter.

20. The circuit of claim 19 wherein the first current source includes:

a third controllable current source coupled between the first power supply conductor and the output of the phase detector and having a control input coupled to the output of the first latch; and a fourth controllable current source coupled between the second power supply conductor and the output of the phase detector and having a control input coupled to the output of the second latch.

* * * * *